United States Patent [19]
Chow et al.

[11] Patent Number: 5,712,865
[45] Date of Patent: Jan. 27, 1998

[54] TEMPERATURE-INSENSITIVE VERTICAL-CAVITY SURFACE-EMITTING LASERS AND METHOD FOR FABRICATION THEREOF

[75] Inventors: Weng W. Chow, Sandia Park; Kent D. Choquette; Paul L. Gourley, both of Albuquerque, all of N. Mex.

[73] Assignee: Sandia Corporation, Albuquerque, N. Mex.

[21] Appl. No.: 535,597

[22] Filed: Sep. 28, 1995

[51] Int. Cl.$^6$ ........................................... H01S 3/19
[52] U.S. Cl. ................................. 372/96; 372/45
[58] Field of Search ........................... 372/96, 50, 45

[56] References Cited

U.S. PATENT DOCUMENTS

| | | | |
|---|---|---|---|
| 4,941,025 | 7/1990 | Tabatabaie | 372/45 |
| 4,947,223 | 8/1990 | Biefield | 357/30 |
| 5,274,655 | 12/1993 | Shieh | 372/45 |
| 5,351,256 | 9/1994 | Schneider et al. | 372/45 |
| 5,457,709 | 10/1995 | Capasso et al. | 372/45 |

OTHER PUBLICATIONS

Zhou et al, "Vertical Cavity Surface Emitting Lasers with Thermally Stable Electrical Characteristics", J. Appl. Phys. 77(6), pp. 2264–2267, Mar. 15, 1995.

Morgan et al, "200 C, 96-nm Wavelength Range, Continuous-Wave Lasing from Unbonded GaAs MOVPE-Grown Vertical Cavity Surface Emitting Lasers", IEEE Photonics Tech. Letters, vol. 7, No. 5, pp. 441–443, May 1995.

Kajita et al, "Temperature Characteristics of a Vertical Cavity Surface Emitting Laser with a Broad-Gain Bandwidth", IEEE Journal of Selected Topics in Quantum Electronics, vol. 1 No. 2, pp. 654–659, Jun. 1995.

P.L. Gourley, S. K. Lyo and L. R. Dawson, "High-Efficiency Continuous-Wave, Epitaxial Surface-Emitting Laser with Pseudomorphic InGaAs Quantum Wells," Applied Physics Letters, vol. 54, pp. 1397–1399, 10 Apr. 1989.

P.L. Gourley, S. K. Lyo, T. M. Brennan, B. E. Hammons, C. F. Schaus, and S. Sun "Lasing Threshold in Quantum Well Surface-Emitting Lasers: Many-Body Effects and Temperature Dependence," Applied Physics Letters, vol. 55, pp. 2698–2700, 25 Dec. 1989.

J.M. Catchmark, R. A. Morgan, K. Kojima, R. E. Liebenguth, G. D. Guth, M. W. Focht, M. T. Asom, L. C. Luther, and G. P. Przybylek, "High Temperature CW Operation of Vertical Cavity Top Surface-Emitting Lasers," Technical Digest for the Conference on Lasers and Electro–Optics, vol. 11, pp. 138–139, 2 May 1993.

W.W. Chow, Stephan W. Koch, and M. Sargent III, Semiconductor-Laser Physics, published by Springer-Verlag, New York, 1994, (no month available).

(List continued on next page.)

Primary Examiner—Rodney B. Bovernick
Assistant Examiner—Yisun Song
Attorney, Agent, or Firm—John P. Hohimer

[57] ABSTRACT

A temperature-insensitive vertical-cavity surface-emitting laser (VCSEL) and method for fabrication thereof. The temperature-insensitive VCSEL comprises a quantum-well active region within a resonant cavity, the active region having a gain spectrum with a high-order subband ($n \geq 2$) contribution thereto for broadening and flattening the gain spectrum, thereby substantially reducing any variation in operating characteristics of the VCSEL over a temperature range of interest. The method for forming the temperature-insensitive VCSEL comprises the steps of providing a substrate and forming a plurality of layers thereon for providing first and second distributed Bragg reflector (DBR) mirror stacks with an active region sandwiched therebetween, the active region including at least one quantum-well layer providing a gain spectrum having a high-order subband ($n \geq 2$) gain contribution, and the DBR mirror stacks having predetermined layer compositions and thicknesses for providing a cavity resonance within a predetermined wavelength range substantially overlapping the gain spectrum.

21 Claims, 8 Drawing Sheets

OTHER PUBLICATIONS

S. W. Koch, F. Jahnke, and W. W. Chow, "Physics of Semiconductor Microcavity Lasers," *Semiconductor Science and Technology*, vol. 10, pp. 739–751, 1995, (no month available).

W. W. Chow, S. W. Corzine, D. B. Young, and L. A. Coldren, "Many Body Effects in the Temperature Dependence of Threshold in a Vertical–Cavity Surface–Emitting Laser," *Applied Physics Letters*, vol. 66, pp. 2460–2462, 8 May 1995.

W. W. Chow, K. D. Choquette, and P.L. Gourley, "Effects of Quantum Well Subband Structure on the Temperature Stability of Vertical–Cavity Semiconductor Lasers," *Applied Physics Letters*, vol. 66, pp. 3266–3268, 12 Jun. 1995.

"PRIOR ART"

TEMPERATURE-INSENSITIVE VERTICAL-CAVITY SURFACE-EMITTING LASERS AND METHOD FOR FABRICATION THEREOF

This invention was made with Government support under Contract No. DE-AC04-94AL85000 awarded by the U.S. Department of Energy. The Government has certain rights in the invention.

FIELD OF THE INVENTION

The present invention relates generally to vertical-cavity surface-emitting lasers, and particularly to temperature-insensitive VCSELs and to a method for fabrication thereof.

BACKGROUND OF THE INVENTION

Vertical-cavity surface-emitting lasers (VCSELs) are becoming increasingly important for many applications including optical interconnects, optical computing and image processing systems, optical recording and readout systems, optical scanning systems, illumination systems, displays, and telecommunications.

To increase the range of application of VCSELs and to reduce costs associated with their manufacture and usage, there is a need for the development of temperature-insensitive VCSELs which can operate over a range of ambient temperatures with minimal if any active heat removal (e.g. by a thermoelectric cooler or the like).

U.S. Pat. No. 5,274,655 to Shieh et al discloses a prior-art temperature-insensitive vertical-cavity surface-emitting laser having a single gain peak located at a first specific wavelength for a known laser temperature, and constructed with a Fabry-Perot resonance at a second specific wavelength that is greater than the first specific wavelength of the single gain peak, for the known laser temperature. In the Shieh et al patent, the Fabry-Perot resonance is taught as being located on a portion of the gain spectrum having a substantial gain variation with wavelength, with no teaching provided or suggested for specific placement of the Fabry-Perot resonance relative to the single gain peak other than being at a greater wavelength.

An advantage of the temperature-insensitive VCSEL and method of the present invention is that a structure is provided for the VCSEL so that a gain spectrum of, the VCSEL includes a contribution from one or more high-order energy subbands ($n \geq 2$) so that a cavity resonance of the VCSEL may be located substantially within a predetermined wavelength range of the gain spectrum wherein the gain is varying with wavelength to a lesser extent than in the prior art.

A further advantage of the present invention is that a temperature-insensitive VCSEL may be operated over a wide range of temperatures (e.g. from about 200–400 K) with any variations in one or more operating characteristics of the VCSEL being substantially reduced by providing a VCSEL structure having a broadened and flattened gain spectrum due to a gain contribution from one or more high-order energy subbands ($n \geq 2$).

Another advantage of the temperature-insensitive VCSEL and method of the present invention is that a specific placement of a wavelength range of a cavity resonance relative to a gain spectrum of the VCSEL may be predetermined for any temperature range of interest to provide a minimum or predetermined level of temperature stability (i.e. temperature insensitivity) of one or more operating characteristics of the VCSEL.

These and other advantages of the temperature-insensitive VCSEL and method for fabrication thereof of the present invention will become evident to those skilled in the art.

SUMMARY OF THE INVENTION

Accordingly, it is a primary object of the present invention to provide a temperature-insensitive vertical-cavity surface-emitting laser (VCSEL) and method for fabrication thereof which overcomes the drawbacks of the prior art.

An additional object of the invention is to provide a temperature-insensitive VCSEL and method for fabrication thereof that operates over a predetermined range of ambient temperature (i.e. a temperature range of interest) while minimizing any variation in one or more operating characteristics thereof, including a threshold current and a lasing output power.

A further object of the invention is to provide a temperature-insensitive VCSEL and method for fabrication thereof that provides a contribution to a gain spectrum therein from at least one high-order energy subband ($n \geq 2$), thereby broadening and flattening the gain spectrum and substantially reducing any variation in one or more operating characteristics of the VCSEL over a predetermined temperature range.

Another object of the invention is to provide a temperature-insensitive VCSEL and method for fabrication thereof that provides a predetermined structure for the VCSEL that substantially reduces any variation in one or more operating characteristics of the VCSEL over a predetermined temperature range, the VCSEL structure being defined by a predetermined composition, layer thickness and number of quantum-well layers within an active region thereof, and a predetermined composition, layer thickness and number of layers within each distributed Bragg reflector (DBR) mirror stack that surrounds the active region and forms a resonant cavity thereabout.

Still another object of the invention is to provide a temperature-insensitive VCSEL and method for fabrication thereof that provides a predetermined wavelength range for a cavity resonance of the VCSEL, the wavelength range being positioned to overlap a broadened and flattened region of a gain spectrum of the VCSEL to substantially reduce any variation in one or more operating characteristics of the VCSEL over a predetermined temperature range.

Additional objects, advantages, and novel features of the invention will become apparent to those skilled in the art upon examination of the following description, or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as described herein, a temperature-insensitive vertical-cavity surface-emitting laser (VCSEL) and a method for fabrication thereof is provided which, according to a preferred embodiment of the present invention, includes a quantum-well active region within a resonant cavity, the active region providing a gain spectrum, and the cavity having a cavity resonance within a predetermined wavelength range positioned to substantially overlap a broadened and flattened portion of the gain spectrum for substantially reducing any variation in operating characteristics of the VCSEL over a temperature range of interest (i.e. a predetermined temperature range). The broadened and flattened portion of the gain spectrum may be generated by providing a predetermined threshold carrier density that is sufficiently large to generate a high-order (n≧2) contribution to the gain spectrum. The predetermined threshold carrier density may be defined during fabrication of the VCSEL structure by adjusting device parameters including the layer thickness and number of quantum-wells in the active region; and the number, compositions and thicknesses of each of a pair of distributed Bragg reflector (DBR) mirror stacks forming the resonant cavity.

Other objects, advantages and novel features of the invention will become apparent from the following detailed description thereof when considered in conjunction with the accompanying drawings.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating a preferred embodiment of the invention and are not to be construed as limiting the invention. In the drawings.

DETAILED DESCRIPTION OF THE INVENTION

Figure 1:
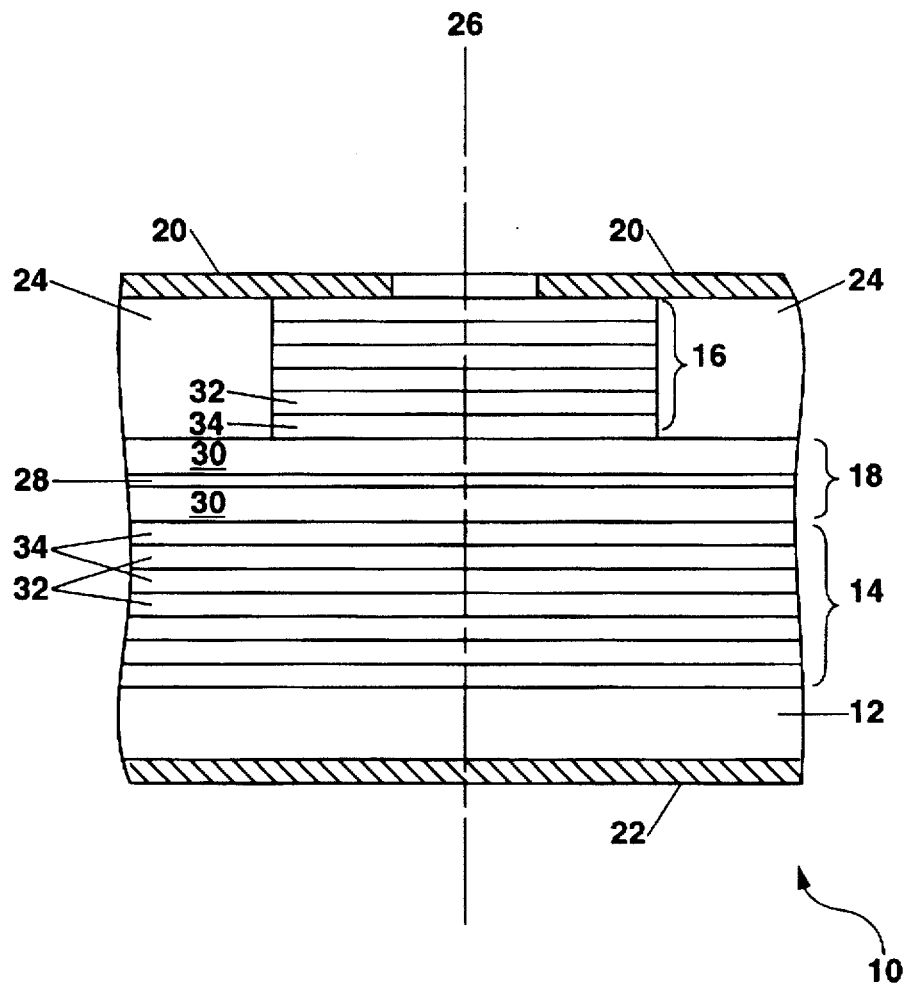
FIG. 1 shows a schematic illustration of an example of a temperature-insensitive VCSEL according to the present invention.

Referring to FIG. 1, there is shown a schematic illustration of an example of a temperature-insensitive VCSEL according to the present invention. In the example of FIG. 1, the temperature-insensitive VCSEL comprises on a semiconductor substrate 12 a plurality of epitaxially-grown compound semiconductor layers forming a first DBR mirror stack 14 (above the substrate) and a second DBR mirror stack 16 with an active region 18 sandwiched therebetween. An upper electrode 20 overlies the second DBR mirror stack 16; and a lower electrode 22 underlies the substrate 12. The second DBR mirror stack 16 in the example of FIG. 1 is patterned to provide an annular current-blocking region 24 about a central portion of the second DBR mirror stack and centered about an optical axis 26 of the VCSEL 10.

The temperature-insensitive VCSEL 10 according to the present invention may be formed from III-V or II-VI compound semiconductor materials (including GaAs, AlAs, InP, AlGaAs, InGaAs, InAlAs, InGaP, AlGaAsP, AlGaInP, InGaAsP, InAlGaAs, or the like) by epitaxial growth methods including molecular beam epitaxy (MBE), metal-organic chemical vapor deposition (MOCVD) or the like as known to the art.

The semiconductor substrate 12 (i.e. a semiconductor wafer) may be GaAs, InP, or the like; and may be doped, for example, n-type with Si (about $10^{18}$ $cm^{-3}$). The substrate 12 as defined herein may include one or more buffer layers (of the same doping type of the substrate) epitaxially grown thereon for smoothing or conditioning an upper surface of the substrate prior to growth of the first DBR mirror stack 14.

In the example of FIG. 1, the DBR mirror stacks (14 and 16) are preferably made highly reflective. One of the mirror stacks preferably has a reflectivity of about 99% or more; and the other mirror stack (i.e. an output coupling mirror) preferably has a slightly lower reflectivity (e.g. about 90–99%) to allow for coupling of a portion of the lasing light out from a resonant optical cavity (i.e. a Fabry-Perot cavity) formed by the mirrors.

The first DBR mirror stack 14 is epitaxially grown above the substrate as a unipolar structure, having a doping type that is preferably of the same polarity as the substrate 12 (e.g. n-type doped with Si to about $5 \times 10^{17}$ $cm^{-3}$ or greater). The first DBR mirror stack comprises a plurality of pairs (preferably about 10 or more) of semiconductor layers, with one layer (e.g. a high-refractive-index first layer 32) in each pair having an index of refraction which is different from the index of refraction of the other layer (e.g. a low-refractive-index second layer 34) in each pair. The semiconductor layers within each DBR mirror stack of the temperature-insensitive VCSEL 10 are preferably about one-quarter-wavelength thick for a wavelength of operation of the VCSEL so that a reflection of light from each pair of semiconductor layers is additive.

An active region 18 is epitaxially grown above the first DBR mirror stack 14. The active region 18 preferably comprises an active layer 28 sandwiched between a pair of cladding layers 30. The active layer 28 comprises one or more quantum-well layers (defined herein as semiconductor layers providing a quantum confinement of electrons and holes therein by means of one or more quantum wells, quantum wires, or quantum dots). The active layer 28 may comprise a predetermined III-V or II-VI compound semiconductor alloy composition (including InGaAs, GaAs, AlGaAs, AlGaInP, InGaP, InCaAsP, AlGaAsP, or InAlGaAs) for providing a specified wavelength or wavelength range for use of the temperature-insensitive VCSEL 10. In some embodiments of the present invention, one or more strained quantum-well layers may be provided with a strain therein acting to broaden and flatten a gain spectrum of the VCSEL 10, with or without additional broadening and flattening of the gain spectrum due to a gain contribution from one or more high-order energy subbands ($n \geq 2$).

In the example of FIG. 1, the cladding layers 30 preferably have an energy bandgap that is larger than the energy bandgap of the active layer 28. Furthermore, the cladding layers 30 may have a semiconductor alloy composition that is uniform in the growth direction, forming a separate confinement heterostructure (SCH) active region 18. Alternately, the semiconductor alloy composition of the cladding layers 30 may be graded in the growth direction (i.e. graded from a higher-bandgap to a lower-bandgap alloy composition for the first-grown cladding layer, and graded from a lower-bandgap alloy to a higher-bandgap composition for the second-grown cladding layer), forming a graded-index separate confinement heterostructure (GRIN-SCH) active region 18.

The first-grown cladding layer 30 in FIG. 1 preferably has a doping type that is the same as the adjacent first DBR mirror stack (e.g. n-type doped to about $5 \times 10^{17}$ cm$^{-3}$ with Si); and the second-grown cladding layer 30 is preferably doped oppositely (e.g. p-type doped to about $5 \times 10^{17}$ cm$^{-3}$ with C) to form a semiconductor p-n or p-i-n junction across the active region 18. The active layer 28 is preferably undoped (i.e. unintentionally doped or intrinsic).

The second DBR mirror stack 16 is formed above the active region 18 and preferably has a doping type opposite that of the first DBR mirror stack 14 (e.g. p-type doped with C to about $10^{18}$ cm$^{-3}$). The second DBR mirror stack also comprises at least one pair of semiconductor layers (each pair including a first layer 32 and a second layer 34), with each layer in the pair being substantially one-quarter-wavelength thick, and having a different index of refraction to provide for reflection of light at the wavelength of operation of the VCSEL 10. The first few pairs of semiconductor layers of each DBR mirror stack nearest to the active region 18 may be grown with a reduced doping concentration as compared to the remaining pairs of layers to reduce an optical loss in the resonant cavity due to dopant impurity absorption and scattering. In one or more of the uppermost pairs of semiconductor layers of the second DBR mirror 16, the doping concentration may be increased to about $10^{19}$ cm$^{-3}$ or more to facilitate electrically contacting the second DBR mirror stack 16 with a deposited upper electrode 20. In some embodiments of the present invention, the second DBR mirror stack 16 may be formed in part from a plurality of deposited dielectric layers (32 and 34) above at least one pair of semiconductor layers, the dielectric layers having differing indices of refraction and being substantially one-quarter-wavelength thick.

In the example of FIG. 1, the upper electrode 20 is preferably deposited after patterning the second DBR mirror stack 16 and forming an annular current-blocking region 24 thereabout as known to the art. The current blocking region 24 may be formed, for example, by etching down at least part way through the second DBR mirror stack 16 to leave a central portion thereof centered about the axis 26 of the VCSEL 10. After patterning the second DBR mirror stack 16, an insulating or high resistivity layer such as a polyimide, a regrown semiconductor layer (e.g. having a doping type opposite that of the DBR mirror stack 16), or the like may be grown, deposited or spun onto the semiconductor wafer. As another example, the current blocking region 24 may be formed by implanting high-energy ions such as hydrogen or oxygen ions outside the central portion of the second DBR mirror stack 16 to increase an electrical resistivity outside the central portion.

To electrically contact the temperature-insensitive VCSEL 10 in the example of FIG. 1, upper and lower electrodes are preferably deposited above the second DBR mirror stack 16 and below the substrate 12, respectively. The upper and lower electrodes (20 and 22, respectively) may be formed from an opaque metallization (i.e. optically thick), a semi-transparent metallization (for example, indium-tin-oxide), or a metallization patterned to define a central opening for transmission of light therethrough. The particular type of metallization for each electrode will depend upon the vertical direction in which light is to be generated. If the light is to be emitted from the top of the device 10 as shown in FIG. 1, then a semi-transparent or patterned metallization is preferred for the upper electrode 20; and the lower electrode 22 may be an opaque metallization. Alternately, if the light is to be emitted or received through the bottom of the device (i.e. through a transparent semiconductor substrate 12), then the lower electrode 22 preferably comprises a semi-transparent or patterned metallization; and the upper electrode 20 may be an opaque metallization.

In the example of FIG. 1, the upper electrode 20 may be formed, for example, by depositing a AuBe/Ti/Au metallization with a thickness of about 150 nm or more above a p-type second DBR mirror stack 16, and defining the central opening therein by a lithographic masking and lift-off process. Likewise in the example FIG. 1, the lower electrode 22 may be formed by depositing a AuGe/Ni/Au patterned or full-surface metallization on the lower surface of an n-type substrate 12. (If the doping types of the substrate and second DBR mirror are reversed in the above example, the above compositions of the electrode metallizations would also be reversed.) After deposition, the metallizations are annealed, forming electrical contacts to the VCSEL 10.

The central opening in a patterned upper electrode 20 as shown in the example of FIG. 1 is generally sized to be about the same or smaller in diameter than the central portion of the second DBR mirror stack 16 so that light may be coupled out from the VCSEL 10 through the central opening while allowing an operating voltage (i.e. a bias voltage) to be applied across the upper and lower electrodes (20 and 22, respectively) for forward-biasing the active region 18 of the VCSEL 10 and generating lasing light therefrom. The temperature-insensitive VCSEL 10 may be mounted within a package for passive heat sinking with or without a heat sink attached thereto, and preferably without any form of active heat sinking (e.g. a thermoelectric cooler) as known to the art.

Figure 2A:
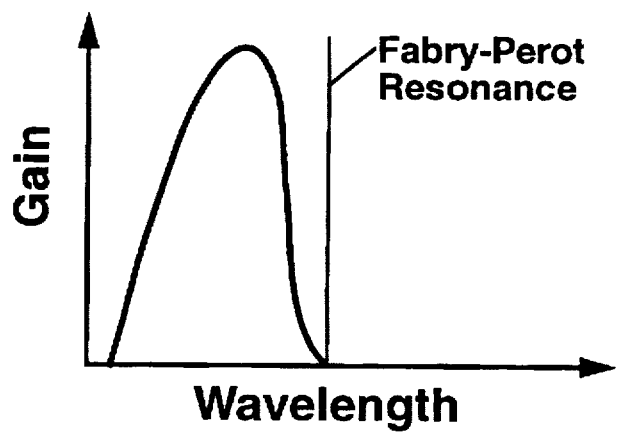
FIGS. 2A–2C show the overlap of a Fabry-Perot cavity resonance with the gain spectrum of a prior-art VCSEL having a single gain peak, with the individual curves showing the cavity/gain overlap at low, intermediate, and high temperatures, respectively, within the range of about 200–400 K.
Figure 2B:
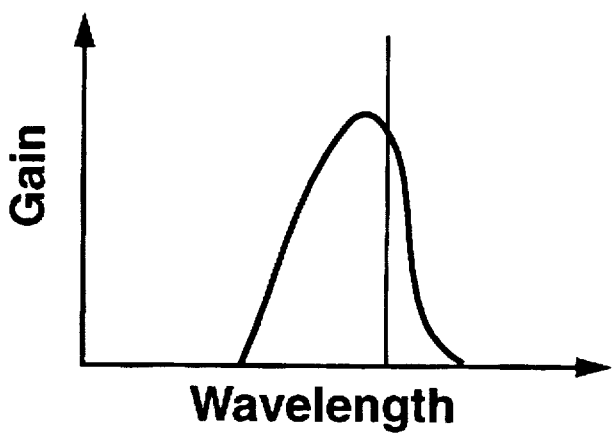
Figure 2C:
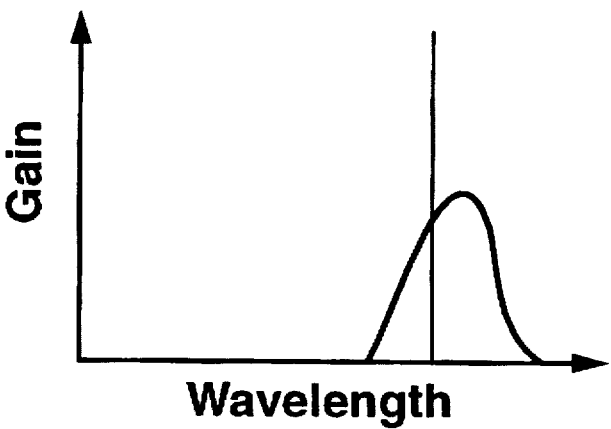
Figure 3A:
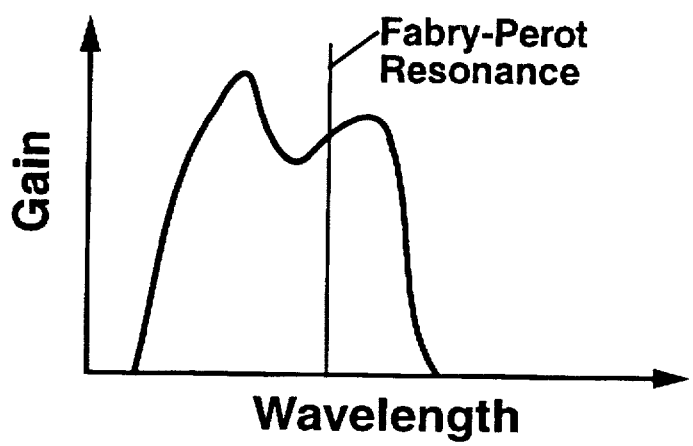
FIGS. 3A–3C show the overlap of a Fabry-Perot cavity resonance with the gain spectrum of a temperature-insensitive VCSEL according to the present invention for the same low, intermediate, and high temperatures of FIG. 2.
Figure 3B:
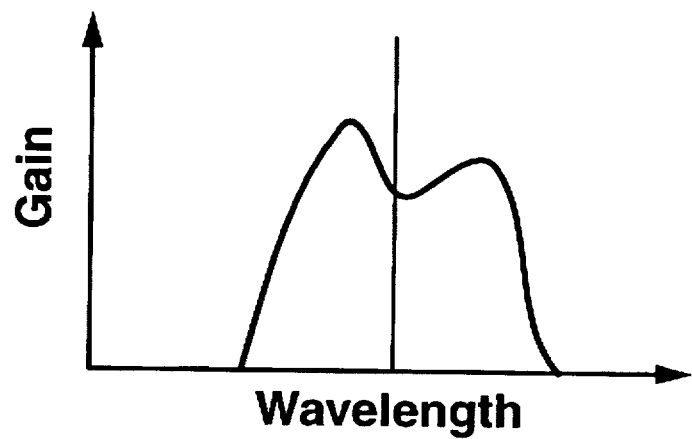
Figure 3C:
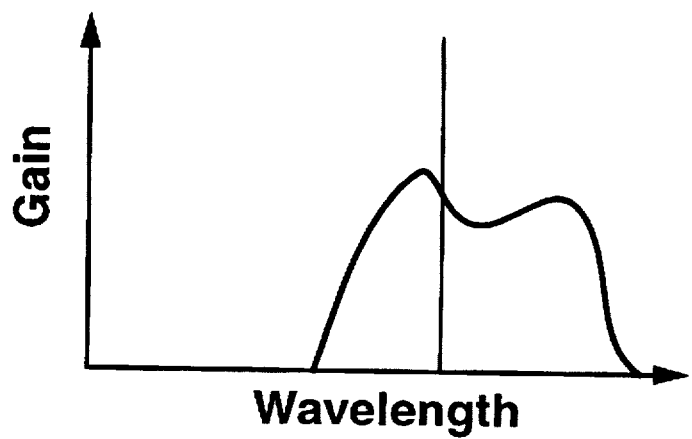

The short, high-Q resonant optical cavity of a VCSEL has well-resolved and widely-spaced cavity resonances (i.e. Fabry-Perot resonances) which generally result in only one cavity resonance overlapping a gain spectrum of the VCSEL as shown in FIGS. 2–3. Since the cavity resonances and gain spectrum shift in wavelength with temperature at different rates, the alignment of the cavity resonance with the gain spectrum generally varies with temperature, thereby affecting operating characteristics of the VCSEL including a threshold current or threshold current density, and a lasing output power. Thus a goal in the development of VCSELs has been to reduce or minimize the dependence of the cavity resonance/gain spectrum alignment on temperature.

FIGS. 2A–2C show the overlap of a Fabry-Perot cavity resonance with a gain spectrum having a single gain peak at low, intermediate, and high temperatures within the range of about 200–400 K. According to the prior art, to form a temperature-insensitive VCSEL the Fabry-Perot cavity resonance is located at a wavelength higher than the wavelength of the gain peak so that as the gain of the VCSEL decreases with increasing temperature the distance between the cavity resonance and the single gain peak closes, thereby maintaining an overall operating threshold current that is substantially constant. Such a prior-art temperature-insensitive VCSEL, however, has only a limited temperature range of usage of about 50 K (e.g. about 300–350 K) due to operation on a long-wavelength side of the gain spectrum wherein the gain is rapidly changing with wavelength. Beyond this limited temperature range, a large variation in the threshold current may occur due to a reduction in the gain at wavelengths lower than the wavelength of the gain peak (as shown at the high temperature of FIG. 2C) or due to a loss of overlap of the Fabry-Perot resonance with the gain spectrum (as shown at the low temperature of FIG. 2A).

According to the present invention, however, a VCSEL 10 having an improved temperature stability or insensitivity (i.e. a temperature-insensitive VCSEL) may be provided by adjusting parameters of the active region 18 and/or the DBR mirror stacks (14 and 16) during formation thereof so that a predetermined threshold current density of the VCSEL 10 is sufficiently large to generate a high-order subband ($n \geq 2$) contribution to the gain spectrum, thereby broadening and flattening the gain spectrum as shown in FIG. 3 and providing for temperature-insensitive operation of the VCSEL 10 over a much larger temperature range of up to 200 K or more.

In FIG. 3, the overlap of a Fabry-Perot cavity resonance with the gain spectrum of a temperature-insensitive VCSEL 10 according to the present invention is shown for the same low, intermediate, and high temperatures of FIG. 2. (This is due to an increase in a carrier-carrier Coulomb repulsion energy with increasing carrier density, the Coulomb repulsion energy acting to shift and reshape the gain spectrum from that shown in FIG. 2 to that shown in FIG. 3.) The generation of the high-order subband contribution to the gain spectrum results in one or more additional gain peaks at lower wavelengths than the single gain peak of FIG. 2. These additional gain peaks act to broaden and flatten the gain spectrum, thereby providing a broadened and flattened region between the peaks in the gain spectrum wherein the gain varies to a lesser extent with wavelength than for the single-peak gain spectrum. By locating the Fabry-Perot cavity resonance to substantially overlap this broadened and flattened region of the gain spectrum over a temperature range of interest (i.e. a predetermined temperature range), the VCSEL 10 may be made temperature insensitive over a much larger temperature range than possible according to the prior art.

Figure 4:
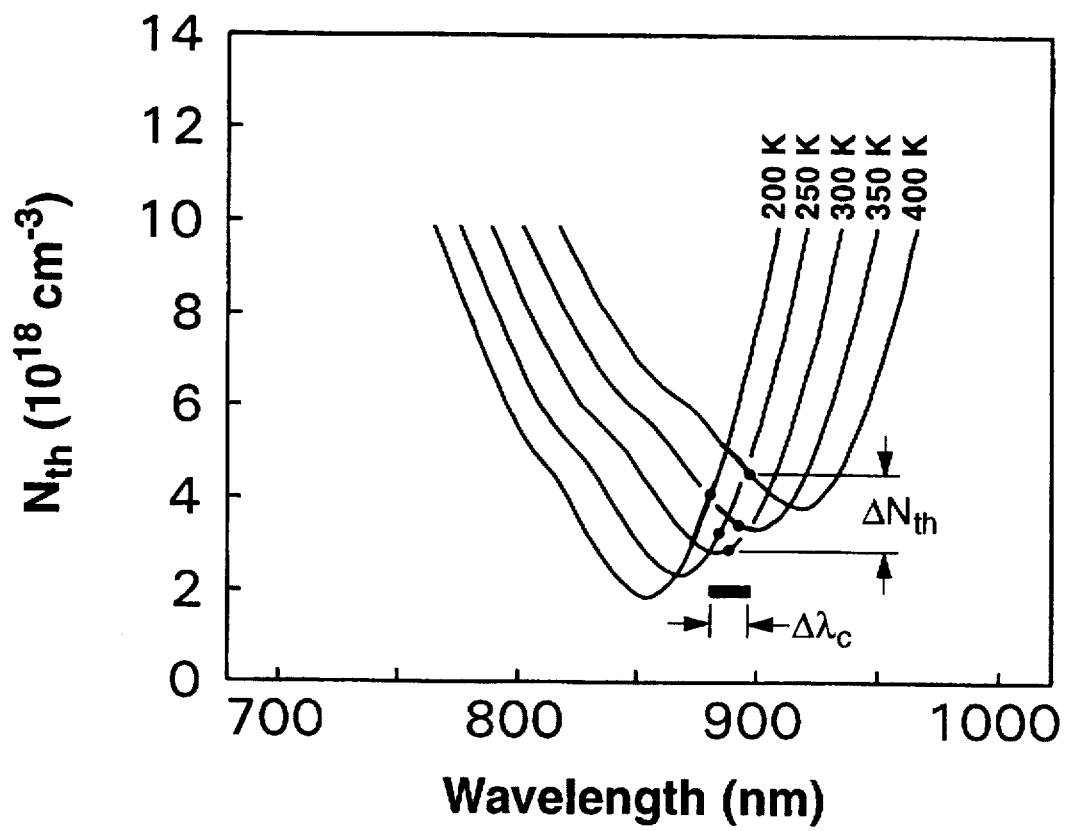
FIG. 4 shows a series of calculated curves depicting the wavelength dependence of the threshold carrier density, $N_{th}$, for various temperatures within the range of 200–400 K for an example of a temperature-insensitive VCSEL according to the present invention having an active region comprising a single 10 nm GaAs quantum-well layer sandwiched between $Al_{0.2}Ga_{0.8}As$ cladding layers.

FIG. 4 shows the effects of ambient temperature on the threshold current density, $N_{th}$, for an example of a GaAs/AlGaAs VCSEL according to the present invention. The calculated curves in the example of FIG. 4 are preferably obtained from calculations with a theory that includes effects due to band-structure, band-filling, and many-body carrier-carrier interactions to achieve a good agreement with fabricated devices. Various aspects of such a microscopic theory are disclosed, for example, in a book entitled "Semiconductor-Laser Physics" by W. W. Chow, S. W. Koch and M. Sargent III published by Springer-Verlag (1994); and in an article entitled "Physics of Semiconductor Microcavity Lasers" by S. W. Koch, F. Jahnke and W. W. Chow published in Semiconductor Science and Technology, volume 10, pages 739–751 (1995); and in another article entitled "Effects of Quantum Well Subband Structure on the Temperature Stability of Vertical-Cavity Semiconductor Lasers" by W. W. Chow, K. D. Choquette and P. L. Gourley published in Applied Physics Letters, volume 66, pages 3266–3268 (Jun. 12, 1995); each of which is incorporated herein by reference.

The temperature dependence of VCSELs is due primarily to the overlap of one or more longitudinal cavity modes (i.e. cavity resonances) with the gain spectrum as shown in FIGS. 2 and 3. Each cavity resonance occurs at a wavelength for which a half-integral number of wavelengths of light circulate within the resonant cavity having an effective optical length, L. The effective optical length L, being the product of a plurality of layer thicknesses and refractive indices through which the light propagates, has a temperature dependence primarily due to differences in the refractive indices with temperature. Thus, to achieve a low threshold carrier density, $N_{th}$, in a VCSEL, one of the cavity resonances is preferably positioned to overlap the gain spectrum near a peak thereof. In general, the alignment of the cavity resonance with the gain spectrum will vary with temperature due to different wavelength shifts with temperature (e.g. about −5 meV/K for the gain peak for a GaAs/AlGaAs VCSEL and only about −0.1 meV/K for the cavity resonance in such a device).

Any misalignment between the gain spectrum and the cavity resonance increases the threshold carrier density, $N_{th}$, as shown in a series of calculated curves at 50 K temperature intervals within the range 200–400 K for the example of a GaAs/AlGaAs VCSEL having a single 10-nm-thick GaAs quantum-well active layer 28 sandwiched between $Al_{0.2}Ga_{0.8}As$ cladding layers 30, and assuming a material threshold gain, $G_{th}$, of 1000 cm$^{-1}$ and a transition linewidth, $\gamma$, of $2 \times 10^{13}$ s$^{-1}$. The material threshold gain, $G_{th}$, is defined by:

$$G_{th} = \Gamma^{-1}[\alpha - (2L)^{-1} ln(R_1 R_2)]$$

where $\Gamma$ is a confinement factor, $\alpha$ is a sum of any optical absorption or scattering losses within the resonant cavity, and $R_1$ and $R_2$ are reflectivities of the DBR mirror stacks, 14 and 16, respectively. Other parameters for the calculated curves in FIGS. 4–8 are bulk material Luttinger parameters, unexcited energy bandgaps, energy band offsets, deformation potentials (for a strained-quantum-well active region), and lattice constants as known to the art. For the calculated curves herein, it has been assumed that the VCSEL temperature behavior is dominated by the overlap of the cavity resonance with the gain spectrum, and that effects due to the temperature dependences of carrier transport and lasing mode confinement may be neglected.

For each curve in the example of FIG. 4 at a particular value of the ambient temperature, there is a wavelength which provides a minimum value for the threshold carrier density, $N_{th}$. And, with an increase in the ambient temperature, the curves in FIG. 4 shift to longer wavelengths and to higher threshold carrier densities.

In FIG. 4, a horizontal bar is shown underneath the curves to represent a wavelength range, $\Delta \lambda_c$, over which a cavity resonance varies over the temperature range from 200 to 400 K. This wavelength range is about 12–15 nm for a rate of change of the cavity resonance with temperature of about 0.06–0.075 nm/K. In FIG. 4, the placement of the resonator wavelength range, $\Delta\lambda_c$, relative to the gain spectrum affects the temperature stability or insensitivity of the threshold carrier density, $N_{th}$, thereby affecting operating characteristics of the VCSEL such as the threshold current (or threshold current density) and the lasing output power. By determining the threshold carrier density for each point of overlap of the cavity resonance with the curves in the example of FIG. 4 (the points of overlap are shown as solid dots on the curves), a measure of the variation, $\Delta N_{th}$, of the threshold carrier density may be determined over a particular range of ambient temperatures (i.e. a temperature range of interest).

Furthermore, the wavelength range, $\Delta\lambda_c$, may be moved relative to the curves in FIG. 4 to determine a specific placement or optimum location for minimizing the variation, $\Delta N_{th}$, of the threshold carrier density over a predetermained temperature range or for providing a predetermined level of temperature insensitivity of one or more operating characteristics of the VCSEL. Then, during fabrication of the temperature-insensitive VCSEL 10, device parameters (especially the number, compositions and thicknesses of layers within the DBR mirror stacks) may be predetermined and adjusted to position the wavelength range, $\Delta\lambda_c$, at this optimum location for minimizing the variation, $\Delta N_{th}$, of the threshold carrier density and thereby improving the temperature insensitivity of the device 10. (Other device parameters including a composition, layer thickness and number of quantum-well layers within the active region 18 of the VCSEL may be predetermined to provide a particular gain spectrum and to determine, at least in part, a value of the material threshold gain, $G_{th}$.)

To convert from the threshold carrier density, $N_{th}$, to a threshold current density, $J_{th}$, a steady-state solution of a carrier density rate equation:

$$J_{th} = \frac{ed}{\eta}\left[w_{sp}(N_{th}) + \frac{2S}{r} N_{th} + C N_{th}^3\right]$$

may be used, with e being an electric charge constant, d being a total thickness of the quantum-well layers (i.e. the number of quantum-well layers multiplied by a layer thickness of each layer), $\eta$ being a factor accounting for an efficiency of transporting carriers from the electrodes to the active region, $w_{sp}$ being a spontaneous emission term, S being a surface recombination velocity, r being a radius of an excited portion of the active layer wherein gain for lasing is generated, and C being an Auger coefficient. In the above equation, the spontaneous emission term, $w_{sp}$, may be numerically computed using a particular energy band structure that may also be used for deriving the gain spectrum.

Using the microscopic theory and the above equation for the threshold current density, $J_{th}$, a relative variation in threshold current density for a VCSEL 10 may be calculated as a function of a difference or detuning $(\lambda_c-\lambda_g)$ between a particular cavity resonance wavelength, $\lambda_c$, and a gain wavelength, $\lambda_g$, which corresponds to a dominant peak in the gain spectrum. (A value of detuning $\lambda_c-\lambda_g=0$ provides a minimum value of the threshold current density for the VCSEL 10 due to a perfect alignment of the cavity resonance with the gain peak at a particular reference temperature, $T_{ref}$.)

Figure 5:
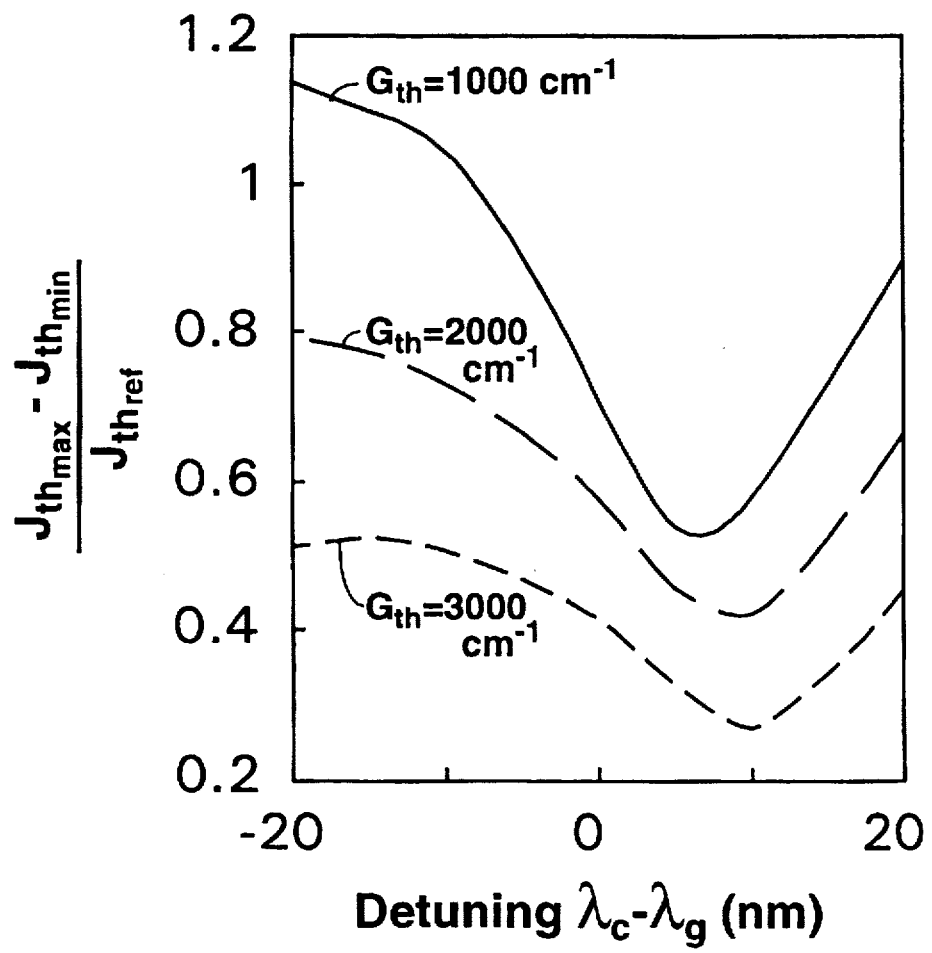
FIG. 5 shows calculated curves of a relative variation in threshold current density as a function of a detuning $(\lambda_c-\lambda_g)$ of a particular cavity resonance wavelength, $\lambda_c$, relative to a gain wavelength, $\lambda_g$, for an example of a temperature-insensitive VCSEL according to the present invention, with each curve corresponding to a particular value of a material threshold gain, $G_{th}$, in the VCSEL.

In FIG. 5, for each value of the detuning calculations are performed to determine a maximum calculated value of the threshold current density, $J_{thmax}$, and a minimum value of the threshold current density, $J_{thmin}$, over a predetermined temperature range of 200–400 K. Then the difference in the threshold current density $(J_{thmax}-J_{thmin})$ is expressed relative to a reference threshold current density, $J_{thref}$, at the reference temperature (selected herein to be a temperature of the gain region when the VCSEL 10 is operated at an ambient temperature of about 300 K). In FIG. 5, the relative variation in threshold current density versus detuning provides a measure of the relative variation in operating characteristics such as the threshold current and lasing output power and further shows the effect of a particular value of the threshold gain, $G_{th}$, on the temperature insensitivity of the VCSEL 10.

The curves in FIG. 5 show that a minimum value of the relative variation in threshold current density may be provided when the detuning $(\lambda_c-\lambda_g)$ has a positive value (i.e. when the VCSEL structure is fabricated with a cavity resonance shifted to longer wavelengths from a dominant gain peak). Thus, when forming a temperature-insensitive VCSEL 10 for use over a predetermined temperature range, it is advantageous to provide a value of detuning near a minimum in the curves in FIG. 5 rather than at a minimum in the threshold current density at the reference temperature (which would occur for zero detuning).

While the exact value of the detuning $(\lambda_c-\lambda_g)$ to provide the best temperature insensitivity will depend upon the VCSEL structure, most of the VCSELs for which calculations have been performed heretofore have shown a minimum value of the relative variation in threshold current density at a positive value of detuning wherein the decrease in semiconductor gain with temperature is compensated by movement of the cavity resonance towards a dominant peak in the gain spectrum. However, exceptions to this trend have been observed for some asymmetrical temperature ranges about a reference temperature, $T_{ref}$.

Furthermore, FIG. 5 shows that the temperature insensitivity or stability of the VCSEL 10 improves with increasing material threshold gain, $G_{th}$, as evidenced by the smaller relative variation in threshold current density as the threshold gain is increased from 1000 cm$^{-1}$ to 3000 cm$^{-1}$. In the example of FIG. 5, a value of $G_{th}=3000$ cm$^{-1}$ provides a relative threshold current density over the entire range of detuning that is smaller than a minimum value for another VCSEL 10 having a material threshold gain of 1000 cm$^{-1}$. The advantageous effect of an increased value of the threshold gain, $G_{th}$, on the temperature insensitivity or stability of the VCSEL 10 is due primarily to a high-order subband $(n \geq 2)$ contribution to the gain spectrum as will be described hereinafter.

The curves shown in FIG. 5 may be further used to calculate a variation, $\Delta I$, in the VCSEL lasing intensity (i.e. the lasing output power per unit area) normalized to the lasing intensity, I, at a particular reference temperature, $T_{ref}$, by using the equation:

$$\frac{\Delta I}{I(T_{ref})} = \left[\frac{J}{J_{thref}} - 1\right]^{-1} \frac{J_{thmax}-J_{thmin}}{J_{thref}}$$

where $J/J_{thref}$ is a relative excitation point which is preferably maintained constant for comparing the relative intensity variation of different VCSEL structures, and I is defined by:

$$I = \frac{\hbar v \eta}{G_{th} e d}(J-J_{th})$$

where $\hbar$ is a photon energy of the lasing light, J is a particular value of the current density.

Figure 6:
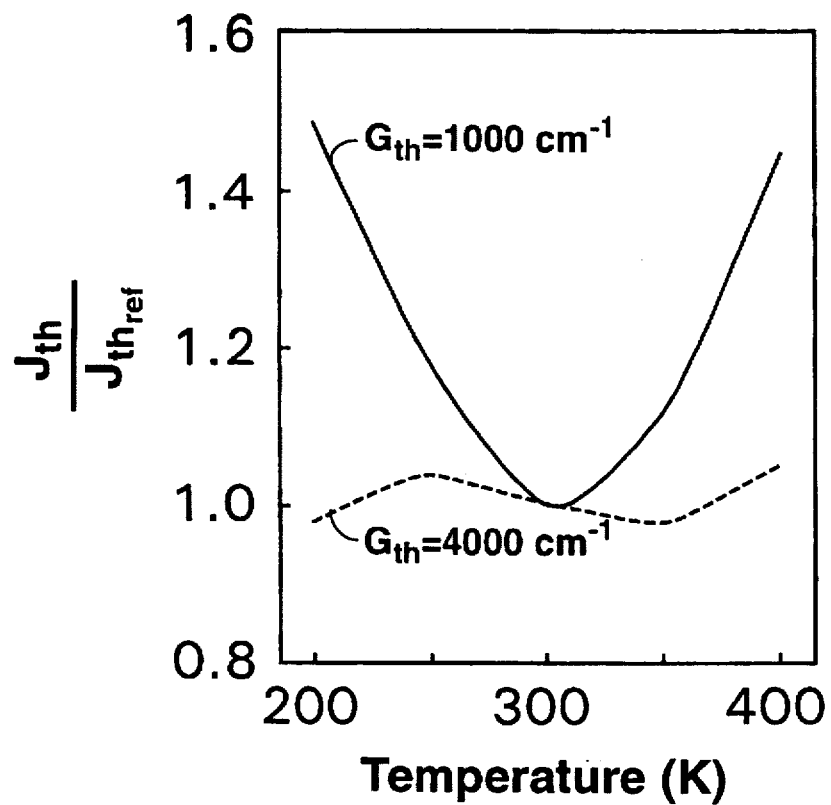
FIG. 6 shows calculated curves of a normalized threshold current density as a function of temperature over the range 200–400 K for an example of a temperature-insensitive VCSEL according to the present invention, with each curve corresponding to a particular value of the material threshold gain, $G_{th}$, in the VCSEL.

In FIG. 6, the advantageous effect of an increased value of the threshold gain, $G_{th}$, on the temperature insensitivity or stability of the VCSEL 10 is further shown by comparing calculations for a low value (1000 cm$^{-1}$) of the threshold gain with calculations for a high value (4000 cm$^{-1}$) thereof. In FIG. 6, the solid curve shows that at the low value of the threshold gain, where n=1 subband transitions are dominant (i.e. the VCSEL gain spectrum is derived primarily from n=1 subband transitions), a normalized threshold current density, $J_{th}/J_{th,ref}$, increases for ambient temperatures deviating from the reference temperature of 300 K to both higher and lower temperatures.

For the dashed curve of FIG. 6, however, the normalized threshold current density varies to a far smaller extent with temperature, with about a 100 K temperature range centered about the reference temperature of 300 K wherein the normalized threshold current density decreases with increasing temperature. This flattened curve is due to the contribution to the gain spectrum from n=2 (or higher) subband transitions which act to broaden and flatten the gain spectrum as shown in FIG. 3. These high-order subband (n≧2) gain contributions allow the cavity resonance of the VCSEL to be located substantially within a predetermined wavelength range of the gain spectrum wherein the gain variation with wavelength is smaller than for the solid curve in FIG. 6 where n=1 subband transitions dominate.

The use of a quantum-well active region 18 in the temperature-insensitive VCSEL according to the present invention provides for gain contributions from a plurality of energy subbands (i.e. n=1 and n≧2), thereby allowing the cavity resonance (and hence the wavelength of the lasing light) to be shifted away from an energy band-edge wherein the gain varies rapidly with wavelength and repositioned to substantially overlap a flattened portion of the gain spectrum.

Figure 7:
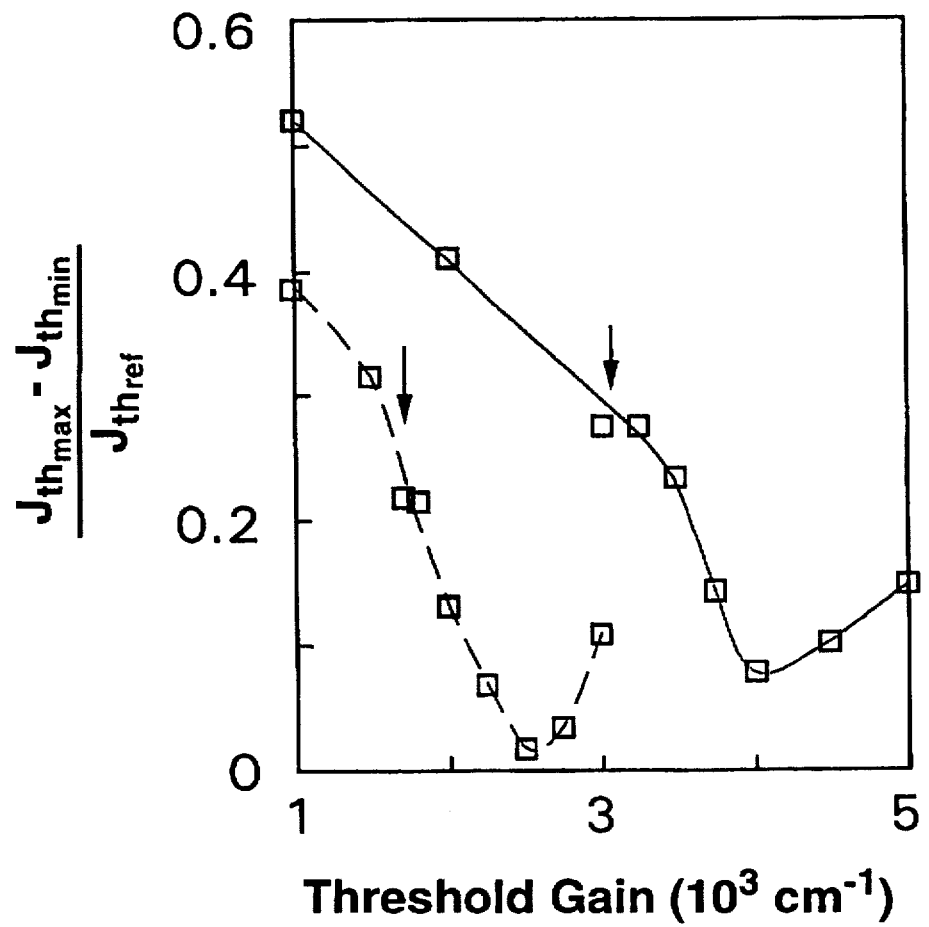
FIG. 7 shows a plurality of calculated points and curves therebetween to show the dependence of the relative variation in threshold current density (at predetermined values of detuning) on the material threshold gain, $G_{th}$, for an example of a temperature-insensitive VCSEL according to the present invention having either a single 10-nm-thick quantum-well active layer (solid curve) or a single 14-nm-thick quantum-well active layer (dashed curve).

FIG. 7 shows a plurality of calculated points (with hand-drawn curves connecting the points) to show the dependence of the relative variation in threshold current density on the material threshold gain, $G_{th}$, for an example of the temperature-insensitive VCSEL of the present invention having either a single 10-nm-thick quantum-well active layer (as shown by the solid curve and calculated points thereon) or a single 14-nm-thick quantum-well active layer (as shown by the dashed curve and calculated points thereon). Each point in FIG. 7 is calculated by selecting a value for the material threshold gain, $G_{th}$, and further using a predetermined value of the detuning that provides the smallest relative variation in threshold current density over the temperature range of 200–400 K for that selected value of the threshold gain.

Furthermore, vertical arrows are provided for each curve in FIG. 7 to show values of the threshold gain above which there is a substantial contribution to the gain from one or more high-order energy subbands (n≧2) leading a dominant gain peak shifting to an n=2 subband transition wavelength from an n=1 subband transition wavelength. For values of the material threshold gain exceeding the values indicated by the arrows in FIG. 7, the relative variation in threshold current density decreases more sharply with increasing threshold gain. Thus, according to the present invention a value of the threshold gain, $G_{th}$, is to be preferred that is larger than the value indicated by the arrows in FIG. 7 for a particular value of the thickness of one or more quantum-well active layers 28 within the active region 18. The threshold gain, $G_{th}$, may be adjusted during formation of the VCSEL 10, for example, by controlling a number of quantum-well active layers 28 within the active region 18 and/or the reflectivity of one or both DBR mirror stacks (14 and 16).

By varying the number of active layers, the confinement factor, Γ, may be varied and reduced to increase the material threshold gain, $G_{th}$, while not affecting an overall modal gain, G, of the device given by:

$$G = \Gamma G_{th}.$$

This is possible since the threshold gain (and the threshold carrier density, $N_{th}$) are defined within the active region; whereas the modal gain is a parameter relating to the entire VCSEL cavity. Thus although, the threshold gain and threshold carrier density in the temperature-insensitive VCSEL 10 according to the present invention will generally be larger than for prior-art VCSELs, the increased values may be provided by adjusting the number, thickness and composition of the quantum-well active layers without necessarily increasing the threshold current (or threshold current density). Additionally, the number, thickness and composition of one or both of the DBR mirror stacks may be adjusted during growth or deposition to provide predetermined values of the threshold gain, $G_{th}$, and threshold carrier density, $N_{th}$, according to the present invention. Furthermore, band-structure engineering as known to the art may be used to reduce the threshold carrier density, $N_{th}$, at a predetermined value of the threshold gain, $G_{th}$, thereby reducing possible deleterious effects due to excessive carrier heating and carrier leakage for some embodiments of temperature-insensitive VCSELs according to the present invention.

Alternately, if predetermined values of the threshold gain, $G_{th}$, and detuning ($\lambda_c - \lambda_g$) are predetermined for the temperature-insensitive VCSEL 10, the thickness of each quantum-well active layer 28 may be adjusted during epitaxial growth to provide a predetermined level of temperature insensitivity of the threshold current density (or other operating characteristics of the VCSEL) over a predetermined range of ambient temperatures (i.e. a temperature range of interest) as shown in the example of FIG. 7.

In FIG. 7, for a particular value of the threshold gain, Gth, less than about 3000 cm$^{-1}$, the relative variation in threshold current density is reduced by providing a larger thickness for the quantum-well active layer 28. FIG. 7 further shows that for a predetermined thickness (and number) of quantum-well active layers, there is an optimum value of the threshold gain, $G_{th}$, for which the variation of the threshold current density (and hence other operating characteristics including the lasing output power) has a minimum value, thereby providing the greatest level of temperature stability or insensitivity for the device 10. This minimum value further depends on the thickness of each quantum-well active layer 28, shifting to lower values of the threshold gain, $G_{th}$, with increasing thickness thereof.

Figure 8:
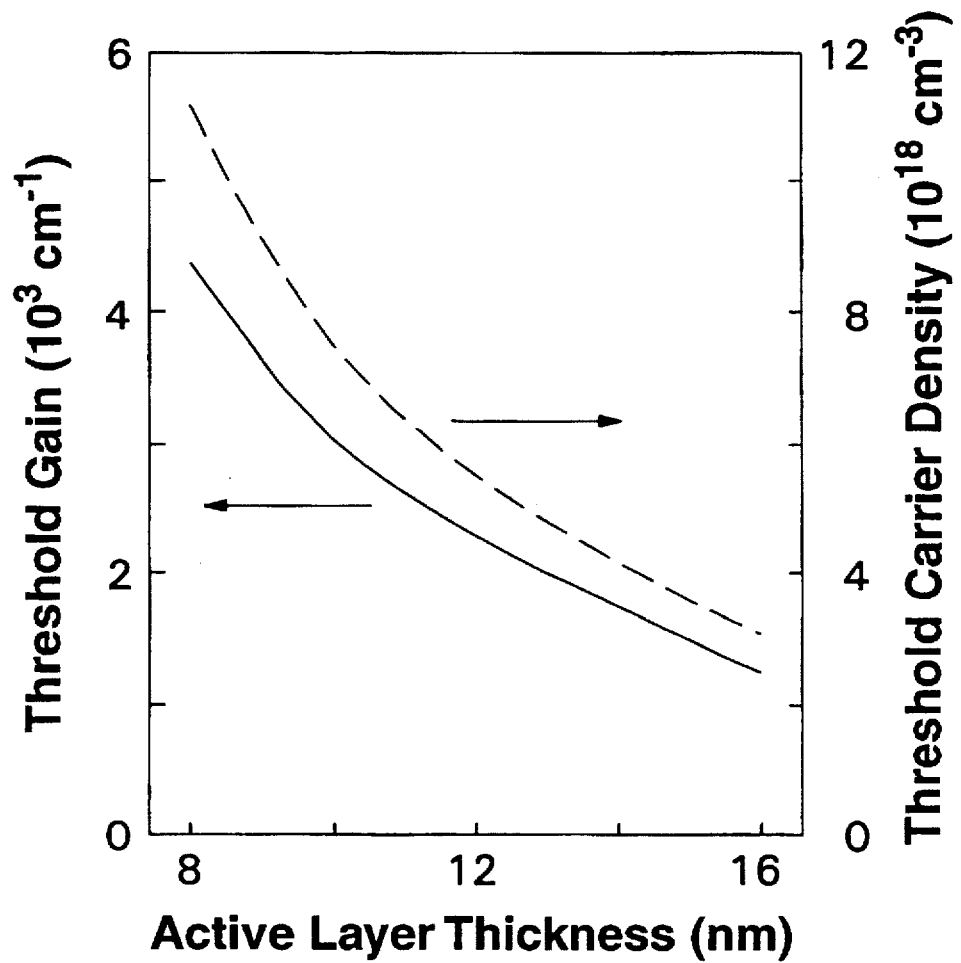
FIG. 8 shows the dependence of the threshold gain and threshold carrier density required for the onset of lasing at an n=2 subband transition wavelength as functions of the thickness of a single GaAs quantum-well active layer sandwiched between $Al_{0.2}Ga_{0.5}As$ cladding layers in an example of a temperature-insensitive VCSEL according to the present invention.

FIG. 8 shows the dependence of the threshold gain and threshold carrier density required for the shift of lasing to the n=2 subband transition wavelength as functions of the thickness of a single GaAs quantum-well active layer sandwiched between Al$_{0.2}$Ga$_{0.8}$As cladding layers in an example of a temperature-insensitive VCSEL according to the present invention. From FIG. 8 it can be seen that an increase in the thickness of the quantum-well active layer reduces the threshold gain and threshold carrier density preferred for providing the high-order subband (n≧2) contribution to the gain spectrum. Thus, a 15-nm-thick GaAs quantum-well active layer 28 provides the preferred high-order subband contribution, but at threshold gain and carrier density levels that are only about one-half that for a 10-nm-thick quantum-well active layer.

There has thus been shown a temperature-insensitive vertical-cavity surface-emitting laser (VCSEL) that comprises a quantum-well active region within a resonant cavity, the active region having a gain spectrum with a high-order subband (n≧2) contribution thereto for substantially reducing any variation in operating characteristics of the VCSEL over a temperature range of interest. A method for forming the temperature-insensitive VCSEL is disclosed that comprises the steps of providing a substrate 12 and forming a plurality of layers thereon for providing first and second distributed Bragg reflector (DBR) mirror stacks with an active region sandwiched therebetween, the active region including at least one quantum-well layer providing a gain spectrum having a high-order subband (n≧2) gain contribution, and the DBR mirror stacks having predetermined layer compositions and thicknesses for providing a cavity resonance within a predetermined wavelength range that substantially overlaps a flattened portion of the gain spectrum.

Examples of GaAs/AlGaAs VCSEL according to the present invention have been shown and described. However, the present invention is not intended to be limited to GaAs/AlGaAs VCSELs, but is applicable to any other type of VCSEL (including VCSEL arrays) comprising III-V or II-VI semiconductor alloy compositions. Thus, the matter set forth in the foregoing description and accompanying drawings is offered by way of illustration only and not as a limitation. Other applications and variations of the temperature-insensitive vertical-cavity surface-emitting laser and method for fabrication thereof will become evident to those skilled in the art. The actual scope of the invention is intended to be defined in the following claims when viewed in their proper perspective based on the prior art.

What is claimed is:

1. A temperature-insensitive vertical-cavity surface-emitting laser (VCSEL) comprising a quantum-well active region within a resonant cavity, the active region providing a gain spectrum at a predetermined threshold carrier density, the threshold carrier density being sufficiently large to generate a high-order subband (n≧2) contribution to the gain spectrum, thereby substantially reducing any variation in operating characteristics of the VCSEL over a temperature range of interest.

2. The temperature-insensitive VCSEL of claim 1 wherein the resonant cavity comprises a pair of distributed Bragg reflector (DBR) mirror stacks having layer compositions and thicknesses selected to position a cavity resonance within a predetermined wavelength range that substantially overlaps a broadened and flattened portion of the gain spectrum over the temperature range of interest.

3. The temperature-insensitive VCSEL of claim 1 wherein the active region includes at least one quantum-well layer, and the threshold carrier density is defined at least in part by a thickness of each quantum-well layer.

4. The temperature-insensitive VCSEL of claim 3 wherein the threshold carrier density is further defined by the number of quantum-well layers in the active region.

5. The temperature-insensitive VCSEL of claim 2 wherein the threshold carrier density is defined at least in part by a reflectivity of at least one of the DBR mirror stacks.

6. A temperature-insensitive vertical-cavity surface-emitting laser (VCSEL) comprising a quantum-well active region within a resonant cavity, the active region providing a gain spectrum having a plurality of gain peaks and including a high-order subband (n≧2) contribution, and the cavity having a cavity resonance within a predetermined wavelength range located between a pair of the gain peaks, the predetermined wavelength range being selected to substantially reduce any variation in operating characteristics of the VCSEL over a temperature range of interest.

7. The temperature-insensitive VCSEL of claim 6 wherein the active region includes at least one quantum-well layer, and the high-order subband (n≧2) contribution to the gain spectrum is provided by a predetermined quantum-well layer thickness of each quantum-well layer.

8. The temperature-insensitive VCSEL of claim 6 wherein the resonant cavity comprises a pair of distributed Bragg reflector (DBR) mirror stacks.

9. The temperature-insensitive VCSEL of claim 6 wherein the active region includes at least one quantum-well layer.

10. A temperature-insensitive vertical-cavity surface-emitting laser (VCSEL) comprising a planar active region including at least one quantum-well layer having a composition and a thickness selected to provide a gain spectrum having a plurality of gain peaks and a contribution from at least one high-order energy subband (n≧2)to provide a substantially flattened portion thereof; and distributed Bragg reflector (DBR) mirror stacks on either side of the active region and forming a resonant cavity thereabout, the cavity having a resonance wavelength located substantially within the flattened portion of the gain spectrum between a pair of the gain peaks.

11. The temperature-insensitive VCSEL of claim 10 wherein the resonance wavelength of the cavity is defined by layer compositions and thicknesses of the DBR mirror stacks.

12. The temperature-insensitive VCSEL of claim 10, wherein the high-order subband contribution to the gain spectrum is defined at least in part by the thickness of each quantum-well layer in the active region.

13. The temperature-insensitive VCSEL of claim 10 wherein the high-order subband contribution to the gain spectrum is defined at least in part by the number of quantum-well layers in the active region.

14. The temperature-insensitive VCSEL of claim 10 wherein the high-order subband contribution to the gain spectrum is defined at least in part by a reflectivity of the DBR mirror stacks.

15. A method for forming a temperature-insensitive vertical-cavity surface-emitting laser (VCSEL) comprising the steps of:

(a) providing a substrate;

(b) forming a plurality of layers on the substrate for providing first and second distributed Bragg reflector (DBR) mirror stacks with an active region sandwiched therebetween, the active region including at least one quantum-well layer providing a gain spectrum having a high-order subband (n≧2) gain contribution, and the DBR mirror stacks having predetermined layer compositions and thicknesses for providing a cavity resonance within a predetermined wavelength range overlapping the gain spectrum.

16. The method of claim 15 wherein the predetermined wavelength range overlaps a flattened portion of the gain spectrum.

17. The method of claim 15 further including the step of adjusting the thickness of each quantum-well layer during growth for defining at least in part the high-order subband (n≧2) gain contribution.

18. The method of claim 15 further including the step of adjusting the number of quantum-well layers during growth for defining at least in part the high-order subband (n≧2) gain contribution.

19. The method of claim 15 further including the step of adjusting the number, compositions and thicknesses of the DBR mirror stacks for defining at least in part the high-order subband (n≧2) gain contribution.

20. A temperature-insensitive vertical-cavity surface-emitting laser (VCSEL) comprising a single-quantum-well active region within a resonant cavity, the single-quantum-well active region providing a gain spectrum at a predetermined threshold carrier density, the threshold carrier density being sufficiently large to generate a high-order subband ($n \geq 2$) contribution to the gain spectrum, thereby substantially reducing any variation in operating characteristics of the VCSEL over a temperature range of interest.

21. A temperature-insensitive vertical-cavity surface-emitting laser (VCSEL) comprising a single-quantum-well active region within a resonant cavity, the single-quantum-well active region providing a gain spectrum having a plurality of gain peaks, and the cavity having a cavity resonance within a predetermined wavelength range located between a pair of the gain peaks, the predetermined wavelength range being selected to substantially reduce any variation in operating characteristics of the VCSEL over a temperature range of interest.

* * * * *